United States Patent
Boyum et al.

(10) Patent No.: US 10,752,539 B2
(45) Date of Patent: *Aug. 25, 2020

(54) LOW EMISSIVITY COATINGS, GLASS SURFACES INCLUDING THE SAME, AND METHODS FOR MAKING THE SAME

(71) Applicant: Apogee Enterprises, Inc., Minneapolis, MN (US)

(72) Inventors: Henry Lynn Boyum, Waseca, MN (US); Randy Leland Stull, Owatonna, MN (US)

(73) Assignee: Apogee Enterprises, Inc., Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/687,071

(22) Filed: Nov. 18, 2019

(65) Prior Publication Data

US 2020/0079688 A1    Mar. 12, 2020

Related U.S. Application Data

(63) Continuation of application No. 15/921,361, filed on Mar. 14, 2018, now Pat. No. 10,513,459.

(Continued)

(51) Int. Cl.
*B32B 15/04* (2006.01)
*B32B 17/06* (2006.01)
(Continued)

(52) U.S. Cl.
CPC .......... *C03C 17/3639* (2013.01); *C03C 17/36* (2013.01); *C03C 17/366* (2013.01); *C03C 17/3615* (2013.01); *C03C 17/3642* (2013.01); *C03C 17/3644* (2013.01); *C03C 17/3649* (2013.01); *C03C 17/3681* (2013.01); *C22C 19/055* (2013.01); *C23C 14/0036* (2013.01); *C23C 14/083* (2013.01); *C23C 14/086* (2013.01); *C23C 14/185* (2013.01);
(Continued)

(58) Field of Classification Search
USPC .......................... 428/426, 428, 432, 434, 688
See application file for complete search history.

(56) References Cited

U.S. PATENT DOCUMENTS

| | | |
|---|---|---|
| 4,900,633 A | 2/1990 | Gillery |
| 4,902,081 A | 2/1990 | Huffer et al. |

(Continued)

FOREIGN PATENT DOCUMENTS

| | | |
|---|---|---|
| EP | 0622645 A1 | 11/1994 |
| EP | 0632507 A2 | 1/1995 |

(Continued)

OTHER PUBLICATIONS

Abstract of Chilean Patent Application No. 201602005 published on Mar. 2, 2017, 5 pages including an English translation.

(Continued)

*Primary Examiner* — Lauren R Colgan
(74) *Attorney, Agent, or Firm* — Dorsey & Whitney LLP

(57) ABSTRACT

A substrate having a coating is disclosed. The coating is formed of a plurality of layers. A base layer of the plurality of layers includes an alloy, and at least two additional layers include silver. A coating for a substrate is also disclosed. A method of coating a substrate is further disclosed.

19 Claims, 4 Drawing Sheets

Related U.S. Application Data

(60) Provisional application No. 62/501,278, filed on May 4, 2017.

(51) Int. Cl.

| | |
|---|---|
| *C03C 17/36* | (2006.01) |
| *C23C 14/00* | (2006.01) |
| *C23C 14/08* | (2006.01) |
| *C23C 14/18* | (2006.01) |
| *C23C 14/34* | (2006.01) |
| *C22C 19/05* | (2006.01) |

(52) U.S. Cl.
CPC ...... *C23C 14/3464* (2013.01); *C03C 2217/73* (2013.01); *C03C 2218/154* (2013.01); *C03C 2218/155* (2013.01); *C03C 2218/156* (2013.01)

(56) References Cited

U.S. PATENT DOCUMENTS

| | | | |
|---|---|---|---|
| 5,038,356 A | 8/1991 | Botez et al. | |
| 5,298,048 A | 3/1994 | Lingle et al. | |
| 5,318,685 A | 6/1994 | Oshaughnessy | |
| 5,332,618 A | 7/1994 | Austin | |
| 5,563,734 A | 10/1996 | Wolfe et al. | |
| 5,643,349 A | 7/1997 | Piper et al. | |
| 5,728,456 A | 3/1998 | Adair et al. | |
| 5,834,103 A | 11/1998 | Bond et al. | |
| 6,060,178 A | 5/2000 | Krisko | |
| 6,231,999 B1 | 5/2001 | Krisko | |
| 6,316,111 B1 | 11/2001 | Krisko | |
| 6,587,288 B2 | 7/2003 | Erz et al. | |
| 6,652,974 B1 | 11/2003 | Krisko | |
| 6,660,365 B1 | 12/2003 | Krisko et al. | |
| 6,802,943 B2* | 10/2004 | Stachowiak | C03C 17/36 |
| | | | 204/192.12 |
| 6,838,159 B2 | 1/2005 | Eby et al. | |
| 6,919,133 B2 | 7/2005 | Hartig et al. | |
| 6,964,731 B1 | 11/2005 | Krisko et al. | |
| 6,974,629 B1 | 12/2005 | Krisko et al. | |
| 7,037,589 B2 | 5/2006 | Hartig et al. | |
| 7,063,893 B2 | 6/2006 | Hoffman | |
| 7,067,195 B2 | 6/2006 | Hoffman et al. | |
| 7,122,252 B2 | 10/2006 | Hoffman | |
| 7,138,182 B2 | 11/2006 | Krisko et al. | |
| 7,157,123 B2 | 1/2007 | Hartig | |
| 7,241,506 B2 | 7/2007 | Hartig | |
| 7,309,527 B2 | 12/2007 | Oshaughnessy et al. | |
| 7,339,728 B2 | 3/2008 | Hartig | |
| 7,419,729 B2 | 9/2008 | Ewasko et al. | |
| 8,062,700 B2 | 11/2011 | Nun et al. | |
| 8,574,718 B2 | 11/2013 | Stull | |
| 8,679,634 B2* | 3/2014 | Imran | C03C 17/36 |
| | | | 428/432 |
| 8,895,149 B2* | 11/2014 | Imran | C03C 17/36 |
| | | | 428/432 |
| 8,895,150 B1 | 11/2014 | Stull | |
| 8,940,399 B2* | 1/2015 | Wuillaume | C03C 17/3652 |
| | | | 428/434 |
| 9,096,041 B2 | 8/2015 | Nun et al. | |
| 9,733,403 B2* | 8/2017 | Disteldorf | C03C 17/3626 |
| 10,513,459 B2* | 12/2019 | Boyum | C03C 17/3615 |
| 2004/0258947 A1 | 12/2004 | Moelle et al. | |
| 2005/0025982 A1 | 2/2005 | Krisko et al. | |
| 2006/0090834 A1* | 5/2006 | Huang | B32B 17/10009 |
| | | | 156/99 |
| 2006/0121315 A1 | 6/2006 | Myli et al. | |
| 2007/0009745 A1 | 1/2007 | Hoffman | |
| 2007/0009747 A1 | 1/2007 | Medwick et al. | |
| 2007/0102291 A1 | 5/2007 | Hartig | |
| 2007/0128449 A1* | 6/2007 | Taylor | C03C 17/3411 |
| | | | 428/432 |
| 2007/0193876 A1 | 8/2007 | Chu et al. | |
| 2007/0248756 A1 | 10/2007 | Krisko et al. | |
| 2007/0281171 A1 | 12/2007 | Coster et al. | |
| 2008/0311389 A1 | 12/2008 | Roquiny et al. | |
| 2009/0130409 A1* | 5/2009 | Reutler | C03C 17/3681 |
| | | | 428/216 |
| 2009/0176086 A1 | 7/2009 | Martin et al. | |
| 2009/0233037 A1 | 9/2009 | Medwick et al. | |
| 2009/0233071 A1 | 9/2009 | Medwick et al. | |
| 2010/0035036 A1 | 2/2010 | McCloy et al. | |
| 2010/0062245 A1 | 3/2010 | Martin et al. | |
| 2010/0221575 A1* | 9/2010 | Stull | C03C 17/36 |
| | | | 428/680 |
| 2011/0085233 A1 | 4/2011 | Furusato | |
| 2011/0236715 A1 | 9/2011 | Polcyn et al. | |
| 2012/0219821 A1 | 8/2012 | Frank et al. | |
| 2012/0225317 A1* | 9/2012 | Imran | C03C 17/36 |
| | | | 428/630 |
| 2013/0334089 A1 | 12/2013 | Remington | |
| 2014/0072784 A1* | 3/2014 | Dietrich | C03C 17/3642 |
| | | | 428/213 |
| 2015/0015940 A1 | 1/2015 | Nakajima | |
| 2015/0020745 A1 | 1/2015 | Imamura et al. | |
| 2015/0043606 A1 | 2/2015 | Hamaguchi et al. | |
| 2015/0345005 A1 | 12/2015 | Ding et al. | |
| 2016/0223729 A1 | 8/2016 | Medwick et al. | |
| 2017/0090078 A1 | 3/2017 | Decoux | |
| 2017/0299786 A1* | 10/2017 | Boyum | C03C 17/3639 |
| 2018/0319703 A1 | 11/2018 | Boyum et al. | |

FOREIGN PATENT DOCUMENTS

| | | |
|---|---|---|
| EP | 1071832 B1 | 9/2002 |
| EP | 1842835 A2 | 10/2007 |
| WO | 0138249 A1 | 5/2001 |
| WO | 0218132 A2 | 3/2002 |
| WO | 2006122900 A1 | 11/2006 |
| WO | 2009114493 A1 | 9/2009 |
| WO | 2010053921 A1 | 5/2010 |
| WO | 2012118469 A1 | 9/2012 |
| WO | 2014164695 A1 | 10/2014 |
| WO | 2015093322 A1 | 6/2015 |
| WO | 2017058887 A1 | 4/2017 |
| WO | 2017184568 A1 | 10/2017 |
| WO | 2018203972 A1 | 11/2018 |

OTHER PUBLICATIONS

Office Action and Search Report issued for Chilean Patent Application No. 201802957 dated Oct. 14, 2019, 33 pages.
EPO, "Office Action", Application No. 09748654.2, dated Feb. 19, 2018, 7 pages.
Lobmann, et al., "Industrial Processing of TiO2 thin Films from Soluble Precursor Powders", Glass Sci. Technology; vol. 76, No. 1, 2003, pp. 1-7.
Medwick, Paul A., "U.S. Appl. No. 61/035,587—"Solar Mirror"", filed Mar. 11, 2008, 28 pages.
National Institute of IP, "Chilean Examination and Search Report", Application No. 1000-2011, dated Feb. 18, 2014, 10 pages.
National Institute of IP, "First Brazilian Office Action", Application No. PI 0921674-0, dated Sep. 24, 2018, 6 pages.
PCT, "International Preliminary Report on Patentability", Application No. PCT/US2009/063149, dated May 10, 2011, 11 page.
PCT, "International Search Report", Application No. PCT/U82016/054134, dated Nov. 20, 2016, 7 pages.
PCT, "International Search Report and Written Opinion", Application No. PCT/US2017/028071, dated Oct. 10, 2017, 12 pages.
PCT, "International Search Report and Written Opinion", Application No. PCT/US2018/022449, dated Jun. 14, 2018, 14 pages.
PCT, "International Search Report and Written Opinion", Application No. PCT/US2009/063149, dated Feb. 9, 2010, 17 pages.
PCT, "Written Opinion", Application No. PCT/US2016/054134, dated Nov. 30, 2016, 8 pages.
Special Metals Corporation, "Inconel alloy 600 product literature", http://www.specialmetals.com; Accessed Jun. 26, 2014, Sep. 2008, 16 pages.

(56) References Cited

OTHER PUBLICATIONS

Extended European Search Report received for European Patent Application No. 19207488.8 dated Mar. 9, 2020, 9 pages.

* cited by examiner

LOW EMISSIVITY COATINGS, GLASS SURFACES INCLUDING THE SAME, AND METHODS FOR MAKING THE SAME

CROSS-REFERENCE TO RELATED APPLICATION

This application claims the benefit under 35 U.S.C. § 119 to U.S. application Ser. No. 15/921,361, filed Mar. 14, 2018, now U.S. Pat. No. 10,513,459 entitled "LOW EMISSIVITY COATINGS, GLASS SURFACES INCLUDING THE SAME, AND METHODS FOR MAKING THE SAME" which in turn claims priority to U.S. Provisional Application No. 62/501,278, filed May 4, 2017 and entitled "LOW EMISSIVITY COATINGS, GLASS SURFACES INCLUDING THE SAME, AND METHODS FOR MAKING THE SAME," which are hereby incorporated by reference in their entirety for all purposes.

BACKGROUND

Advances in window technology have reduced energy consumption by affecting and improving heating, cooling, and lighting. Various types of glass coatings have been developed for these purposes. Examples of glass coatings for reduced energy consumption include solar control coatings that reduce glare or overheating from the sun, and low-emissivity ("low-E") coatings which reduce radiative heat gain or loss often accounting for significant heat transfer through a window.

Low-E coatings generally have a high reflectance in the thermal infrared (IR) and may or may not have high transmittance in the visible spectrum. Thus, they are low-emissive of thermal infrared. Some such coatings may admit solar near IR (NIR) to help heat a building, such as in a cold climate. Some such coatings may reflect the NIR back, such as in a warm climate. The low-emissivity optical properties are generally obtained by application of a material with certain intrinsic properties or alternatively, multiple materials may be combined to achieve the particular desired performance. Thin films of metals have been used to provide low emissivity coatings. Thin films forming infrared-reflection film are generally a conductive metal such as silver, gold or copper.

Coatings including such metals can be made highly transparent to visible radiation or light, while remaining reflective in the infrared. Such infrared-reflective coatings often include infrared-reflection materials and transparent dielectric materials. The infrared-reflection materials reduce the transmission of heat through the coating. The dielectric materials allow transmission of IR and visible light and control other properties and characteristics of the coating, such as color and durability. However, solar heat gain via windows having highly reflective coatings remains a concern to builders and tenants desiring energy efficiency.

Accordingly, there is a need in the industry for a coating for a visible light transmissive substrate that provides improved solar heat gain coefficients over currently available coatings and coated substrates while also providing the visible light transmission benefits of metal coatings.

SUMMARY

Embodiments of the invention relate to low-emissivity coatings having an alloy base layer and two or more metal layers.

An example embodiment of an article comprising a substrate and a coating applied to the substrate is disclosed. The coating includes a plurality of layers, wherein a base layer of the plurality of layers includes a Nickel-Chromium-Molybdenum alloy and two additional layers include silver.

An example embodiment of a coating for use with clear substrates is disclosed. The coating includes a film comprising a plurality of coextensive layers. The plurality of coextensive layers of the coating includes a base alloy layer, including an alloy of nickel, chromium, and molybdenum. The plurality of coextensive layers of the coating includes a first metal layer disposed on the base alloy layer. The plurality of coextensive layers of the coating includes a first barrier layer disposed on the first metal layer. The plurality of coextensive layers of the coating includes a first oxide layer disposed on the first barrier layer. The plurality of coextensive layers of the coating includes a second metal layer disposed on the first oxide layer. The plurality of coextensive layers of the coating includes a second barrier layer disposed on the second metal layer. The plurality of coextensive layers of the coating includes a second oxide layer disposed on the second barrier layer. The plurality of coextensive layers of the coating includes an overcoat layer disposed on the second oxide layer.

An example embodiment of a method of coating a substrate is disclosed. The method includes applying an alloy layer directly onto a substrate by sputtering, the alloy layer including a Nickel-Chromium-Molybdenum alloy material. The method includes applying a first metal layer onto the substrate by sputtering, the first metal layer including one or more of a gold material, a silver material, or a copper material. The method includes applying a second metal layer onto the substrate by sputtering, the second metal layer including one or more of a gold material, a silver material, or a copper material, wherein the alloy layer, the first metal layer, and the second metal layer form at least a portion of a coating for the substrate.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings.

DETAILED DESCRIPTION

Embodiments of the invention relate to low emissivity and low solar heat gain coatings. More particularly, embodiments relate to a low emissivity coatings having solar heat gain coefficients below about 0.25, and substrates having the coating.

The dielectric film is generally used to anti-reflect the infrared-reflection film and to control other properties and characteristics of the coating, such as color and durability. Such films typically have Light to Solar Gain Ratio (LSG) (visible Light Transmittance divided by the Solar Heat Gain Coefficient) ratios of >1.5. The Solar Heat Gain Coefficient (SHGC) is a measure, on a scale of 0.0 to 1.0, which expresses the proportion of incident solar thermal radiation that is transmitted by a window, with 0.0 being no transmission and 1.0 being 100% transmission. Visible Light Transmittance (VLT) describes the amount of visible light, on percentage scale, that can pass through an object such as a coating or coated window. Each of these can be independently altered by different coatings.

Figures 1, 2:
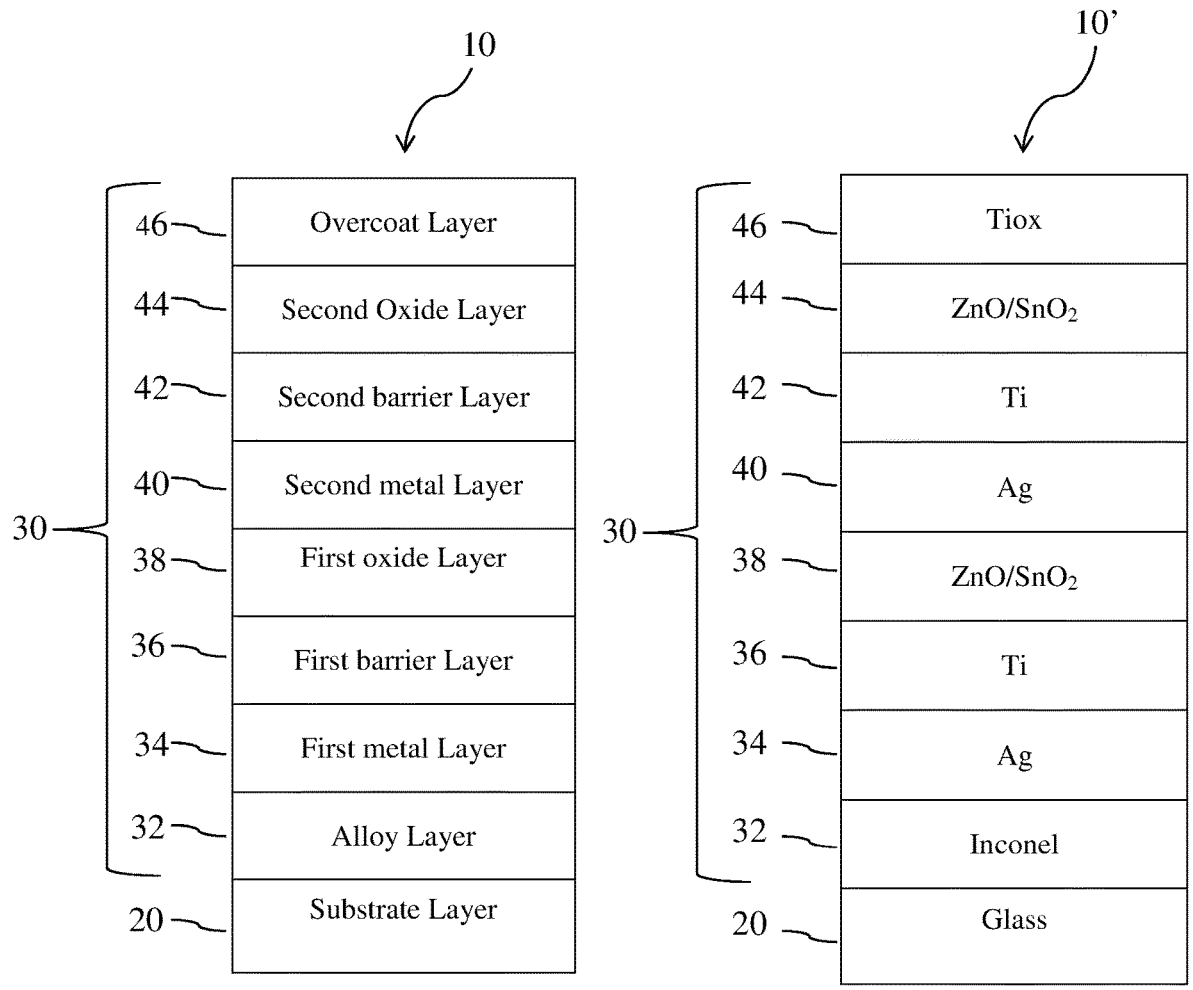
FIG. 1 is a schematic of a coated substrate according to embodiments.
FIG. 2 is a schematic of an example coated substrate according to embodiments.

FIG. 1 is a schematic of a coated substrate 10. FIG. 2 is a schematic of an example coated substrate 10' having specific materials therein. The coated substrate 10 includes a substrate 20 and a coating 30 disposed thereon. The substrate 20 may be any transparent, substantially transparent, or light transmissive substrate such as glass, quartz, any plastic or organic polymeric substrate, or any other suitable material or combination of materials. Further, the substrate may be a laminate of two or more different materials and may be a variety of thicknesses. The substrate 20 may also be arranged to include low-emissive properties, apart from a film or coating, such as, for example, as can be accomplished by controlling the iron content in a glass substrate. In one embodiment, the substrate 20 is float glass. Alternatively, the substrate 20 may be a type of glass having low-emissive properties, such as, but not limited to a borosilicate or PYREX™. The substrate 20 may be a window pane or panel. The substrate 20 may have a thickness greater than about 10 μm, such as about 10 μm to about 10 cm, about 100 μm to about 3 cm, or about 5 mm to about 1 cm.

The coating 30 may be a thin film coating. The coating 30 may be a low-emissivity coating having a relatively low SHCG (e.g., below about 0.25, below about 0.23, or below about 0.21). The coating 30 is applied to a surface of a substrate 20. The coating 30 may be a low-emissivity coating that may include one or more microscopically thin, virtually invisible, metallic layers deposited on a substrate 20 surface. The coating 30 may be transparent or substantially transparent to at least a portion of visible light incident thereto, and may be opaque or substantially opaque to at least some visible light and/or infrared radiation incident thereto. Accordingly, the coating 30 on the substrate 20 surface may be formed of low-emissive material (e.g., one or more film layers) arranged to allow for varying amounts of, for example, solar heat gain by varying the amount of visible light and/or radiation permitted to pass through the substrate 20. The coating 30 has the general properties of reflecting radiant infrared energy, thus tending to keep radiant heat on the same side of the glass from which it originated.

The coating 30 may be arranged in a layered system as shown in FIG. 1. In an example, the layer system of the coating 30 includes of a plurality of layers, depicted on or otherwise attached to the substrate 20. The coating 30 may be formed or provided in the form of a film. The film may be a single layer or a plurality of layers. Thus, one or more films may form the coating 30. The film(s) are provided in the form of layers. The thickness of each layer in a plurality of layers of the coating 30 may be substantially identical or may vary from layer to layer. The thickness of the layer or layers may be uniform, or may vary across its width or length. Likewise, the thickness of an individual layer may vary across its width or length. In one example, the film or a portion thereof may have or include a gradual change or graded thickness across at least a portion thereof. For example, the layers may, in some instances, increase in thickness or decrease in thickness with increasing distance from the substrate. The one or more layers may be provided in a contiguous relationship, that is, directly on top of or adjacent to another layer or the substrate.

The coating 30 may include an alloy layer 32, a first metal layer 34, a first barrier layer 36, a first oxide layer 38, a second metal layer 40, a second barrier layer 42, a second oxide layer 44, and an overcoat layer 46. As shown in FIGS. 1 and 2, in examples, the alloy layer 32 may be disposed directly on the substrate, first metal layer 34 may be disposed directly on the alloy layer 32, the first barrier layer 36 may be disposed directly on the first metal layer 34, the first oxide layer 38 may be disposed directly on the first barrier layer 36, the second metal layer 40 may be disposed directly on the first oxide layer 38, the second barrier layer 42 may be disposed directly on the second metal layer 40, the second oxide layer 44 may be disposed directly on the second barrier layer 42, and the overcoat layer 46 may be disposed directly on the second oxide layer 44. In examples, one or more additional layers may be disposed between any of the layers 32-46 described above. The one or more additional layers may include any of an additional alloy layer, barrier layer, oxide layer, metal layer, or overcoat layer as described below.

The coating 30 includes the alloy layer 32. The alloy layer 32 may be a base layer disposed directly on the substrate 20. The instant disclosure differs from conventional coatings, which typically require a base metal oxide layer disposed on the substrate 20. Typical window coatings include base metal oxide layers to provide a barrier to Na diffusion from the glass substrate into the coating, and to provide a primer layer to promote coating stack adhesion to the glass substrate. As disclosed herein, the inventors have found that removing the conventional metal oxide base layer, providing the alloy layer 32, and adding the second metal layer 40, lowers the SHGC of the coating while maintaining VLT % over similar coatings.

The alloy layer 32 may include a ceramic, polymer, or metal such as alloy or super alloy of nickel, chromium, and molybdenum. For example, the alloy layer 32 may include a nickel-based alloy or super alloy, or an austenitic nickel-based alloy or super alloy. For example, the alloy or super alloy may be a nickel/chromium/molybdenum (hereinafter an "NCM") alloy, for example INCONEL™, such as INCONEL™ 625. INCONEL™ 625 is an NCM alloy composed of Ni (about 58% minimum), Cr (about 20 to about 23%), Mo (about 8 to about 10%), Nb and Ta (about 3.15 to about 4.15%) and Fe (about 5% maximum) by weight. Typical Properties of INCONEL™ 625 include a density of 8.44 g/cm$^3$, a melting point of about 1350° C., a co-efficient of expansion of 12.8 μm/m° C. (20-100° C.), a modulus of rigidity of 79 kN/mm$^2$, and a modulus of elasticity of 205.8 kN/mm$^2$. INCONEL™ 625 is covered by the following standards: BS 3076 NA 21, ASTM B446 and AMS 5666. INCONEL™ 625 is available from, and is the tradename of Special Metals Corporation of Huntington, W. Va. In examples, NCM alloys differing in relative component amounts from INCONEL™ 625 may be used. For example, INCONEL™ may be obtained for use in any suitable form. As used herein, the term "INCONEL™" may include any of the properties or compositions of any INCONEL™ product, such as INCONEL™ 625. INCONEL™ is available in several different alloys, although alternative forms may be used in place of INCONEL™ 625 and may not depart from the overall scope of the present disclosure. INCONEL™ 625 is equivalent to: W.NR 2.4856 (Multi-Alloys cc, South Africa), UNS N06625 (Sandmeyer Steel Co., Philadelphia, Pa.) and is also known as AWS 012 as well as under common trade names of Chronin® 625, Altemp® 625, Haynes® 625, Nickelvac® 625 and Nicrofer® 6020. In examples, the alloy layer 32 may include a molybdenum-based alloy or super alloy. In examples, the alloy layer 32 may include a chromium-based alloy or super alloy, or an austenitic chromium-based alloy or super alloy.

Accordingly as shown in FIGS. 1 and 2, alloy layer 32 is adjacent the substrate 20. The alloy layer 32 (e.g., NCM layer) may be deposited substrate 20 or otherwise attached thereto. The alloy layer 32 may have a thickness of less than about 150 angstroms (Å), such as in a range of about 5 Å to about 150 Å, about 10 Å to about 120 Å, about 20 Å to about 100 Å, about 25 Å to about 75 Å, about 30 Å to about 60 Å, about 10 Å to about 50 Å, about 20 Å to about 50 Å, about 20 Å to about 60 Å, about 30 Å to about 70 Å, about 50 Å to about 100 Å, about 35 Å, less than about 120 Å, less than about 100 Å, or less than about 80 Å. The alloy layer 32 may form an infrared reflection region or may form a portion thereof. In embodiments, the alloy layer 32 may have a thickness greater than about 150 Å. The alloy (e.g., NCM alloy) of the alloy layer 32 may advantageously form an oxide layer when heated and retain strength over a wide temperature range. The alloy layer 32 may also provide a greater reflectance of visible light at the surface of the coating 30 than a traditional oxide base layer. Further, the alloy layer 32 may provide the increased SHGC and exemplary reflective properties at the base layer, while maintaining a visual appearance of current coating technologies. While NCM alloys are specifically described, other alloys or super alloys suitable for use in high temperature applications which may have one or more of oxidation and corrosion resistant properties or are otherwise suited for extreme environments or have excellent mechanical strength and creep resistance at high temperature, and/or good surface stability may be acceptable for use with the present invention. NCM alloys may be sputtered in an inert atmosphere to provide a layer composition which may be applied to the substrate 20.

One or more additional layers of the coating 30 may include metallic materials such as metals (e.g., pure metals or alloys) or metal oxides. In addition to an alloy or super alloy layer, a metal layer or film may also be applied. To this end, a metal such as silver, copper, or gold, and alloys thereof may be applied to the substrate 20, and more particularly to the substrate 20 with one or more layers thereon. Accordingly, as shown in FIGS. 1 and 2, contiguous with the alloy layer 32 is a first metal layer 34 forming an infrared reflective layer. This first metal layer 34 may include a suitable reflection material, and in particular an infrared-reflection material, such as but not limited to silver, gold and/or copper, as well as alloys thereof. The first metal layer 34 in one example includes a silver layer. In an example, the reflective first metal layer 34 is formed of silver or silver combined with another material, such as another metal including, but not limited to copper, gold, platinum, palladium. The material is formed into a composition which may be applied as a layer or film to the substrate 20 or layers thereon. In examples, the first metal layer 34 may include a plurality of sublayers therein, such as silver layer and a copper layer. The first metal layer 34 may be deposited on the alloy layer 32 or otherwise attached thereto. Accordingly, as can be seen in FIGS. 1-2, the first metal layer 34 is positioned on top of the alloy layer 32. The first metal layer 34 may have a thickness of about 50 Å or more, such as in a range from about 50 Å to about 250 Å, about 100 Å to about 200 Å, about 150 Å to about 200 Å, or about 140 Å to about 180 Å.

As shown in FIGS. 1 and 2, a first barrier layer 36 and a second barrier layer 42 may be provided in the coating 30. The first barrier layer 36 and the second barrier layer 42 may include a material that is readily oxidized. The first barrier layer 36 and the second barrier layer 42 may include titanium metal (e.g., pure titanium metal having substantially no oxidation or only trace amounts of oxidation) or may include titanium oxide (or a portion thereof may be a titanium oxide such as titanium dioxide). The first barrier layer 36 may be contiguous with the first metal layer 34. To this end, the first barrier layer 36 may be positioned on the first metal layer 34 (on the alloy layer 32), such as a titanium layer disposed on a silver layer (disposed on an NCM alloy layer). The first barrier layer 36 may be deposited on the first metal layer 34 or otherwise attached thereto. The first barrier layer 36 may have a thickness of at least about 10 Å. For example, the first barrier layer 36 may have a thickness of about 10 Å to about 70 Å, such as about 10 Å to about 40 Å, about 20 Å to about 50 Å, about 30 Å to about 60 Å, about 40 Å to about 70 Å, about 20 Å to about 50 Å, or about 25 Å to about 45 Å.

As shown in FIGS. 1 and 2, a first (e.g., lower or middle) oxide layer 38 and a second (e.g., top) oxide layer 44 are provided. These oxide layers each form a generally transparent dielectric film region which is applied over a surface or over a reflective region or layer. Useful dielectric film materials include oxides of zinc, tin, indium, bismuth, titanium, hafnium, zirconium, and alloys thereof, as well as silicon nitride and/or silicon oxynitride. While oxides are specifically referenced herein, alternative dielectric materials may be suitable for purposes of the present invention. In the examples provided herein, the oxide layers (e.g., dielectric layers) may be formed of zinc oxide (ZnO), tin oxide ($SnO_2$) or mixtures thereof (e.g., $ZnO/SnO_2$). For example, an oxide layer (e.g., first oxide layer) or transparent dielectric film may be formed of or include a zinc tin oxide mixture. A dielectric film may be a single layer of a single dielectric material or may include two or more sublayers of the same or different dielectric materials. It should be understood that while reference is made to metal oxides, this should not be considered limited to fully oxidized metal oxides but also includes those species that can form an agglomeration and have partial oxidation states. They can be designated as a M(metal)ox(oxide), such as Tiox, Snox, etc.

The first oxide layer 38 may have a thickness of at least about 500 Å. For example, the first oxide layer 38 may have a thickness ranging from about 500 Å to about 1,000 Å, such as about 500 Å to about 850 Å, about 600 Å to about 800 Å, about 700 Å to about 900 Å, about 700 Å to about 850 Å, about 750 Å to about 800 Å, about 800 Å to about 1,000 Å, or about 750 Å to about 850 Å.

The first oxide layer 38 may be contiguous with the first barrier 36. To this end, the first oxide layer 38 may be positioned on the first barrier layer 36, such as a combination zinc oxide and tin dioxide layer disposed on a titanium layer. The first oxide layer 38 may be deposited on the first barrier layer 36 or otherwise attached thereto.

As shown in FIGS. 1 and 2, a second metal layer 40 is provided. The second metal layer 40 may be similar or identical to the first metal layer 34 in one or more aspects.

For example, the second metal layer may include any of the materials herein above for the first metal layer 34, such as silver. The second metal layer may include any of the thicknesses or ranges disclosed herein for the first metal layer 34, such as a thickness in a range of about 100 Å to about 200 Å. The second metal layer 40 may be contiguous with the first oxide layer 38. To this end, the second metal layer 40 may be positioned on the first oxide layer 38, such as a silver layer disposed on a combination zinc oxide and tin dioxide layer. The second metal layer 40 may be deposited on the first oxide layer 38 or otherwise attached thereto. The second metal layer 40 may provide and additional infrared reflective layer.

As shown in FIGS. 1 and 2, a second barrier layer 42 is provided. The second barrier layer 42 may be similar or identical to the first barrier layer 36 in one or more aspects. For example, the second barrier layer 42 may include any of the materials herein above for the first barrier layer 36, such as titanium. The second barrier layer 42 may have a thickness suitable to help protect the coating 30. The second barrier layer 42 may include any of the thicknesses or ranges disclosed herein for the first barrier layer 36, such as a thickness in a range of about 10 Å to about 70 Å. The second barrier layer 42 may be contiguous with the second metal layer 40. To this end, the second barrier layer 42 may be positioned on the second metal layer 40, such as a titanium layer disposed on a silver layer. The second barrier layer 42 may be deposited on the second metal layer 40 or otherwise attached thereto.

The second oxide layer 44 described above may be provided. The second oxide layer 44 may be contiguous with the second barrier layer 42. To this end, the second oxide layer 44 may be positioned on second barrier layer 42, such as a combination zinc oxide and tin dioxide layer disposed on a titanium layer. The second oxide layer 44 may be deposited on the second barrier layer 42 or otherwise attached thereto. In examples, the thickness of the second oxide layer 44 may be different than the thickness of the first oxide layer 38. For example, the second oxide layer 44 (e.g., top oxide layer) may have a thickness of about 100 Å to about 170 Å, such as about 120 Å to about 160 Å, about 110 Å to about 140 Å, about 120 Å to about 150 Å, about 130 Å to about 160 Å, about 130 Å to about 150 Å, or about 130 Å to about 140 Å.

As shown in FIGS. 1 and 2, the second oxide layer 44 (top oxide layer) may also (optionally) carry or include an overcoat 46 attached to a surface and may be contiguous therewith. Accordingly, the second oxide layer 44 may be positioned between the second barrier 42 layer and the overcoat 46. The overcoat 46 may be composed of or include a metal such as titanium or may be formed of a titanium oxide (Tiox) as shown in FIG. 2. The overcoat 46 may have a thickness of at least about 100 Å. For example, the overcoat 46 may have a thickness ranging from about 100 Å to about 180 Å, about 110 Å to about 140 Å, about 120 Å to about 150 Å, about 130 Å to about 160 Å, about 130 Å to about 150 Å, about 100 Å to about 140 Å, about 140 Å to about 180 Å, or about 135 Å to about 145 Å. The overcoat 46 may have a surface which is exposed or otherwise facing the environment in which the substrate 20 with coating 30 thereon is placed. From an optics standpoint, the second oxide layer 44 and the overcoat 46 (e.g., Tiox layer) can be treated as single layer.

In embodiments, any of the layers of the coating 30 disclosed herein may comprise a plurality of discrete sublayers collectively forming the respective layer. Each discrete sublayer of a layer may include any of the materials disclosed herein for the respective layer. In some embodiments, the sublayers in a single layer may each include the same material. For example, a barrier layer may include a plurality of discrete titanium sublayers therein. In some embodiments, the sublayers in a single layer may each include a different material. For example, an oxide layer may include discrete sublayers of tin dioxide and zinc oxide therein.

According to the foregoing example arrangement, a substrate 20 has deposited on its surface a sandwich-type arrangement of film layers forming a coating 30. The coating includes the (base) alloy layer 32 (e.g., INCONEL™), the first metal layer 34 (e.g., silver) between the alloy layer 32 and the first barrier layer 36 (e.g., titanium). The first oxide layer 38 (e.g., ZnO/SnO$_2$) is between the first barrier layer 36 and the second metal layer 40 (e.g., silver). The second metal layer 40 is disposed between the first oxide layer 38 and the second barrier layer 42 (e.g., Titanium). The second barrier layer 42 may be disposed between the second metal layer 40 and the second oxide layer 44 (e.g., ZnO/SnO$_2$). The second oxide layer 44 may have an overcoat 46 disposed thereon. Barrier layers 36, 42 may also be provided between the first metal layer and the first oxide layer, or between the first oxide layer 38 and the second metal layer 40. While the foregoing layers are described as being contiguous, it is contemplated that materials or layers may be placed between the respective layers suitable for the intended purposes of the coating without departing from the overall scope of the present invention. The low emissivity coating 30 may have a thickness in a range from about 2,000 Å to about 3,500 Å, such as about 2,500 Å to about 3200 Å, about 2,700 Å to about 3,000 Å, about 2,800 Å to about 2,900 Å, about 2,600 Å to about 2,850 Å, about 2,850 Å to about 3,000 Å, or more than about 2,000 Å.

The foregoing described coating 30 may be used with any transparent, substantially transparent, or light transmissive substrate 20 to form a coated substrate 10 or 10'. In some embodiments, the low-emissivity coating 30 may be a thin coating on the substrate 20 or window pane within its airspace that reflects thermal radiation or inhibits its emission, reducing heat transfer through the glass. The low-emissivity coating 30 may thus be positioned on an interior facing surface or face of glass (e.g., the interior facing surface on an outer pane of glass in a double paned glass unit) or may be located on the outside surface of a pane of glass (e.g., on an outer surface of an inner pane of a double paned glass unit) and may further be provided with additional features, such as, but not limited to, a film or a body tint which can be used to further reflect solar radiation, or may also include polarizing materials. In some embodiments, the low-emissivity coating 30 may be disposed on an inner surface of an inner pane of glass (e.g., an inner surface of two outboard laminated panes of glass. The substrate 20 may be further retained by a window frame. The window frame may likewise have unique features, such as an insulated window frame that minimizes conductive heat transfer.

Figure 3:
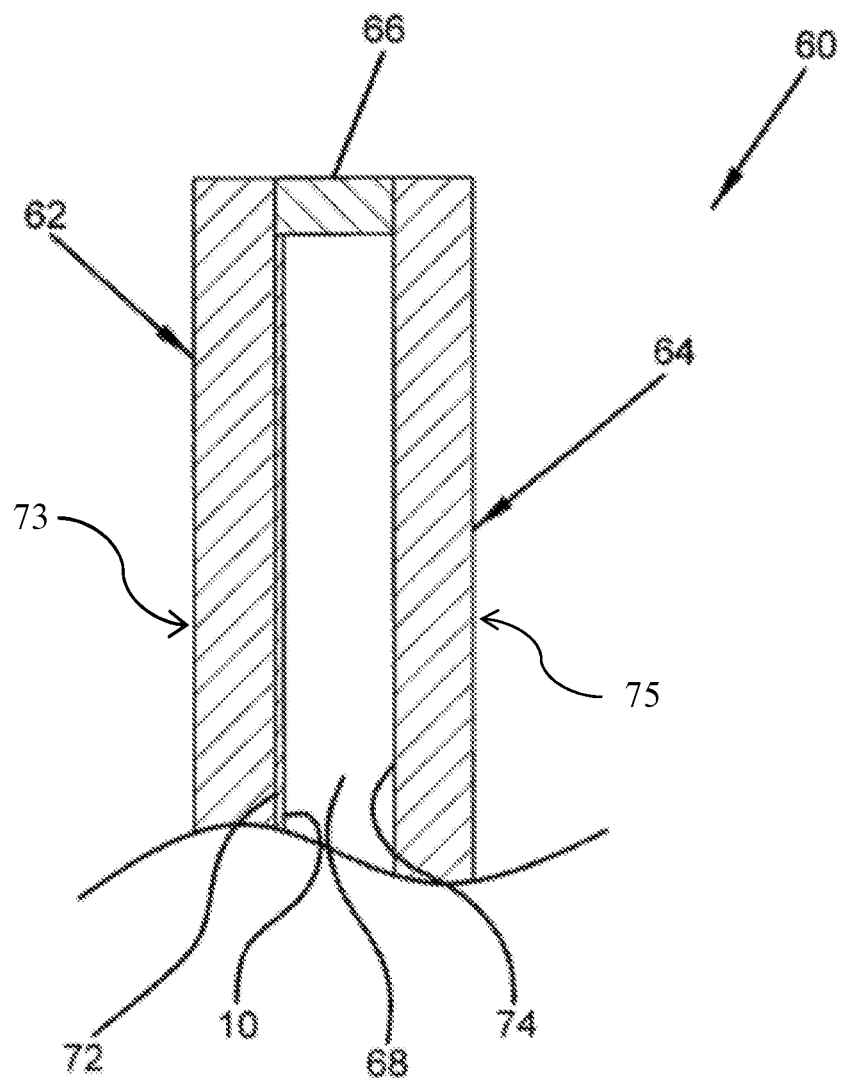
FIG. 3 is a schematic of an insulating glass unit according to embodiments.

The substrate 20 may be used in a variety of arrangements and settings where control of reflectance and transmittance is required or desired. In one example of an embodiment, the substrate 20 may be used as, or form, a window or skylight. To this end, the coating 30 may be combined with a window pane. The window pane may also have unique properties, such as insulating properties. Accordingly, as shown in FIG. 3, in one example of an embodiment, the low-emissivity coating 30 is applied to a surface of an insulating glass ("IG") unit 60, or IG window unit. As shown, the IG unit 60 may be a multi-pane window having a first pane 62 including a sheet of glass or other transparent material, and a second pane 64 including sheet of glass or other transparent material, sealed at their peripheral edges by a conventional sealant 66 to form a chamber 68 therebetween. By sealing the peripheral edges of the first and second panes 62, 64 and introducing a low-conductance gas, such as argon, into the chamber 68, a typical, high insulating value IG unit 60 is formed. The first pane 62 may be an outermost portion of the IG unit 60 and the second pane may be an innermost portion of the IG unit 60. For example, the first pane 62 may be an external surface of a building and the second pane 64 may be an interior surface of a building. The first pane 62 may include an inner surface 72 and an outer surface 73 (e.g., external to the chamber 68). The second pane 64 may include an inner surface 74 and an outer surface 75 (e.g., external to the chamber 68). In one example of an embodiment, the coating 30 may be applied on the inner surface 72 of the first pane 62 within the chamber 68, as illustrated. According to the former, as light passes through the first pane 62, the light contacts the alloy layer 32 of the coating 30 first.

In embodiments, the inner surface 74 of the second pane 64 within chamber 68 may alternatively or additionally be coated with the coating 30. Accordingly, it is to be appreciated that FIG. 3 illustrates only one embodiment of an IG unit in which the coating 30 of the present disclosure may be employed. For example, the coatings of the present disclosure may be applied to an IG unit having more than two panes of glass.

A variety of techniques may be used to apply the coating 30, or the films or layers forming the coating 30 described herein. An example of a method of forming a coating 30 on a substrate having a surface is provided. This surface may be optionally prepared by suitable washing or chemical preparation. A coating 30 may be deposited on the surface of the substrate 20. The coating 30 may be deposited in one or more of a series of discrete layers, or as a thickness of graded film, or combinations thereof. The coating 30 can be deposited using any suitable thin film deposition technique(s).

In one example of an embodiment, sputtering may be used to deposit or apply one or more portions of the coating 30 on the substrate 20. As is known, sputtering is a technique used to deposit thin films of a material onto a surface or substrate. By first creating a gaseous plasma and then accelerating the ions from this plasma into some source material (e.g., a target), the source material is eroded by the arriving ions via energy transfer and is ejected in the form of neutral particles, either individual atoms or clusters of atoms or molecules. As these neutral particles are ejected, they travel in a straight line unless they come into contact with something, whether it is another particle or a nearby surface. A substrate placed in the path of these ejected particles will be coated by a thin film of the source material or target. As is known, a gaseous plasma is a dynamic condition where neutral gas atoms, ions, electrons and photons exist in near balanced state simultaneously. One can create this dynamic condition by metering a gas, such as argon or oxygen into a pre-pumped vacuum chamber, allowing the chamber pressure to reach a specific level, and then introducing a live electrode into this low pressure gas environment using a vacuum feed through. An energy source, such as RF, DC, MW may be used to feed and thus maintain the plasma state as the plasma loses energy into its surroundings. The type of sputtering used may be diode sputtering, magnetron sputtering, confocal sputtering, direct sputtering or other suitable techniques.

In an example method of depositing the coating 30, DC magnetron sputtering is used. Magnetron sputtering involves transporting a substrate 20 through a series of low pressure zones in which the various film regions that make up the coating 30 are sequentially applied. Thus, the metallic films or layers thereof are sputtered from metallic sources or targets, which may occur in an inert atmosphere. To deposit transparent dielectric film or oxide layers, the target may be formed of the dielectric itself. Alternatively, the dielectric film may also be applied by sputtering a metal target in a reactive atmosphere. In this regard, for example to deposit zinc oxide, a zinc target can be sputtered in an oxidizing atmosphere. The thickness of the deposited film may be controlled by varying the speed of the substrate and/or by varying the power placed upon the targets. In an alternative embodiment of a method for depositing thin film on a substrate, plasma chemical vapor deposition may be used. Such plasma chemical vapor deposition involves the decomposition of gaseous sources via a plasma and subsequent film formation onto solid surfaces, such as glass substrates. The film thickness can be adjusted by varying the speed of the substrate as it passes through a plasma zone and/or by varying the power and/or gas flow rate within each zone.

Figure 4:
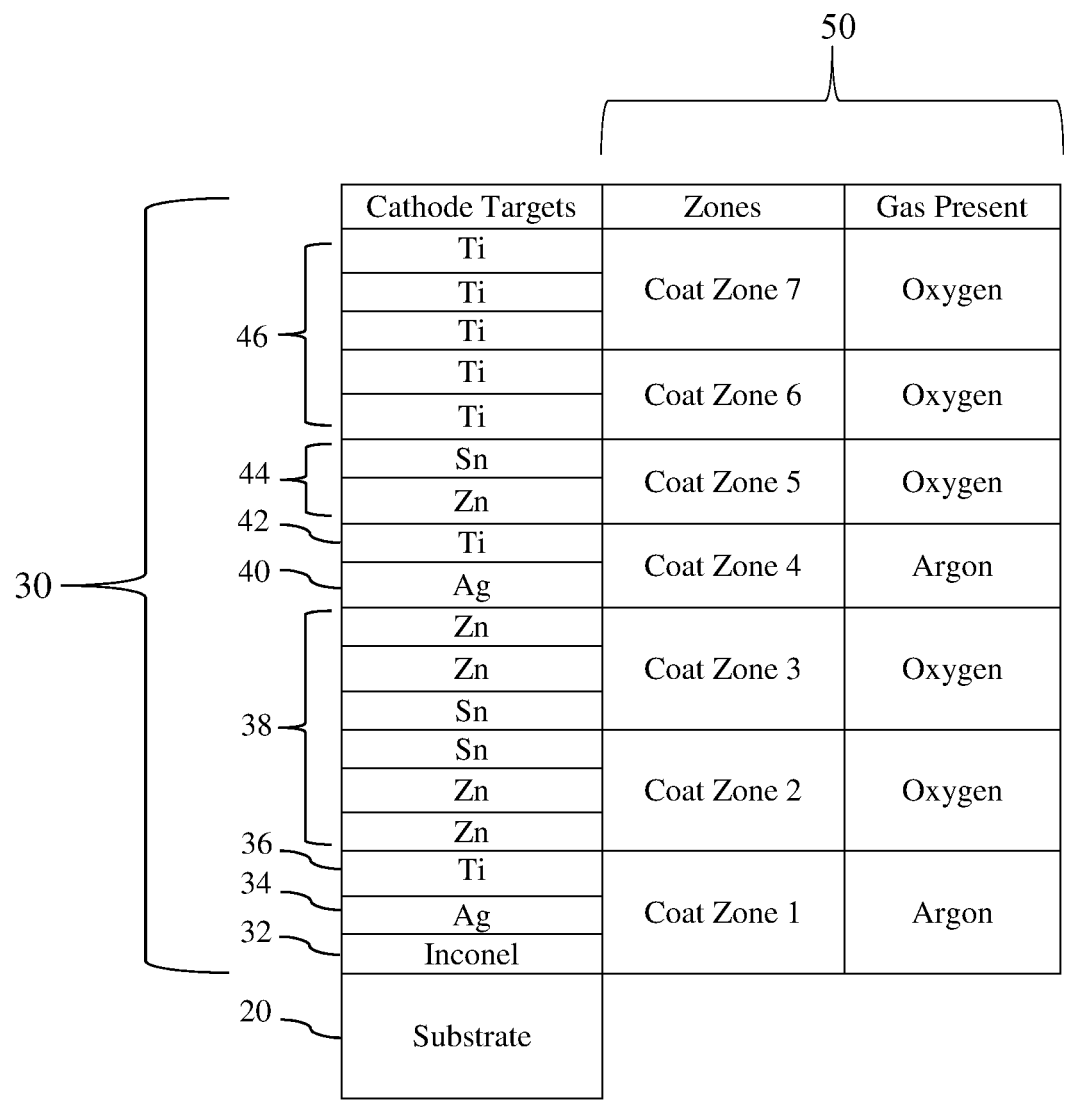
FIG. 4 is a schematic of a method of coating a substrate according to embodiments.

FIG. 4 is a schematic of a method for coating a substrate. In an example of a method for depositing a coating 30, a coater, represented generally by 50 in FIG. 4, is used to deposit a coating in the arrangement described herein which may include, in sequence from the substrate 20 surface outward toward an exposed environment (e.g., environment within the chamber 68), an alloy layer 32 region, a first infrared-reflection film region or first metal layer 34, a first barrier layer 36 region, a first transparent dielectric film region or first oxide layer 38, a second infrared-reflection film region or second metal layer 40, a second barrier 42 region, a second transparent dielectric film region or second oxide layer 44, and an outermost layer or overcoat 46. A suitable coater is an architectural glass coater available from Applied Films. Generally, a coater with a minimum of 22 cathode positions and the ability to achieve vacuum of approximately $10^{-6}$ torr is desirable.

Referring to FIG. 4, to accomplish the foregoing coating arrangement, the substrate 20 is positioned at the beginning of the coater 50 and conveyed, by conveyor assembly (not shown), into the first coat zone 51, and then subsequently through a plurality of additional proximally positioned coat zones. It is understood that conveying may be accomplished by any suitable means, mechanical, computerized, or by hand operation. In one example, the conveyance of the substrate may be by transport rollers on a conveyor assembly. Each coat zone may be provided with one or more sputtering chambers or bays adapted to collectively deposit a film region, sublayer, or layer on the substrate 20. In each of the bays are mounted one or more targets including a sputterable target material. In the examples provided herein, the target may be a compound of zinc or tin, or a metal or metal compound.

The substrate is conveyed into a first coat zone 51 wherein the alloy layer 32 and the first metal layer 34 are formed, providing a first infrared-reflection film region are applied directly over or contiguous with the substrate 20. The first coat zone 51 is provided with an inert atmosphere. In one example, the inert atmosphere includes argon, although alternative inert gases may be used without departing from the overall scope of the present invention. The active sputtering bays of this coat zone each have a target. The number and type of target, e.g., planar or cylindrical or the like, can be changed for purposes suitable to the manufacture or otherwise as desired. The first target in a bay may be an NCM alloy target (e.g., for the alloy layer 32). The target in the subsequent or adjacent bay may be a metallic silver target (e.g., for the first metal layer 34). The target in a further subsequent bay may be a metallic titanium target (e.g., for the first barrier layer 36). The substrate is conveyed beneath the NCM alloy target, thereby depositing the NCM alloy in the form of a film having a thickness of any of the alloy layer thicknesses disclosed herein, such as about 20 Å to about 50 Å. The substrate 20 is then conveyed under the silver target, depositing the silver in the form of a film having a thickness of any of the first metal layer thicknesses disclosed herein, such as about 130 Å to about 180 Å. As a result, the first infrared-reflection film region is deposited in the form of an NCM alloy film and a silver film contiguous therewith, having a thickness of between about 150 Å and about 230 Å. The substrate is then conveyed beneath the titanium target in the next bay, thereby depositing a first barrier 36 region in the form of a film comprising titanium and having a thickness suitable to protect the silver first metal layer 34 from oxidation. The thickness of the titanium deposited to form the first barrier layer 36 may include any of the thicknesses for the first barrier layer 36 disclosed herein, such in a range of about 20 Å to about 50 Å

The substrate 20 is then conveyed into a second coat zone 52 and a third coat zone 53. The second and third coat zones 52 and 53 are each provided with three sputtering chambers (or "bays") which are adapted collectively to deposit a first transparent dielectric film region or first oxide layer 38 comprising zinc tin oxide ($ZnO/SnO_2$). All of these bays are provided with sputtering targets comprising a compound of zinc or tin. The number and type of sputtering targets, e.g., planar or cylindrical, and the like, can be varied for manufacturing or other preferences. The targets are sputtered in an oxidizing atmosphere to deposit the first transparent dielectric film region or first oxide layer 38 in the form of an oxide film comprising zinc and tin. In this regard, the oxidizing atmospheres in the second and third coat zones 52, 53 may each consist of or include oxygen. The targets of the second coat zone 52 may include first and second zinc targets in adjacent bays and a tin target which forms the third target in a third bay in the coat zone. The targets may be formed of any suitable type, such as a planar or cylindrical target or the like, or may be provided in any number suitable for the purposes provided. The third coat zone 53 may include a first bay with a tin target and two subsequent bays with zinc targets, forming second and third targets. The substrate is conveyed beneath all of the noted targets in second and third coat zones 52 and 53, such that the transparent dielectric film region or first oxide layer 38 is applied in the form of an oxide film comprising zinc and tin and having a thickness between about 750 Å to about 800 Å.

Following the fourth coat zone 54, the substrate 20 (and layers deposited therein) is conveyed through a fourth coat zone 54 which has two active sputtering bays. In the fourth coat zone 54, the second infrared-reflection film region or second metal layer 40 (e.g., silver layer) is applied directly over or contiguous with the second transparent dielectric film region or first oxide layer 38. Sputtering occurs substantially as described with respect to the first infrared-reflection film region. In this regard, the fourth coat zone 54 has an inert atmosphere, which may be formed by argon gas. The sputtering bays in this coat zone each have a target. The target may be a planar target or cylindrical target or the like. Each bay may also include a plurality of targets. The target in the first bay is a metallic silver target, and the target in the adjacent second bay is a metallic titanium target. The metallic silver target forms second metal layer 40 and the metallic titanium target forms second barrier layer 42. The substrate 20 is conveyed beneath the target in the first bay to deposit the second infrared-reflection film region as a metallic silver film having a thickness of any of the thicknesses disclosed herein for the second metal layer, such as between about 150 Å and about 180 Å. The substrate 20 is then conveyed at the same rate beneath the metallic titanium target in the adjacent bay to deposit a second barrier layer 42 film region comprising titanium in any of the thicknesses disclosed herein for the second barrier layer such as between about 20 Å and about 50 Å.

The substrate is then conveyed through a fifth coat zone 55 where the second transparent dielectric film region or second oxide layer 44 is applied. The coat zone in the example provided has two sputtering bays, and each such bay may be provided with one or more targets. The targets may be any suitable shape or type as described herein and may comprise a sputterable material that is a compound of zinc or tin. The fifth coat zone 55 is provided with an oxidizing atmosphere including oxygen. Alternatively, this atmosphere may comprise argon and oxygen. The substrate 20 is conveyed beneath these targets in fifth coat zone 55 such that the second transparent dielectric film region or second oxide layer 44 is applied as an oxide film comprising zinc and tin and having a thickness of any of thicknesses disclosed herein for the second oxide layer 44, such as between about 120 Å and about 160 Å.

The substrate is conveyed into a sixth coat zone 56 and a seventh coat zone 57, wherein the outermost portion of the second transparent dielectric film region or second oxide layer 44, namely, the overcoat 46, is applied. The sixth and seventh coat zones 56, 57 each have two sputtering bays, and each contain an oxidizing atmosphere consisting essentially of oxygen. Alternatively, this atmosphere may comprise argon, nitrogen and/or oxygen. The sputtering bays in each of these coat zones are each provided with one or more targets of any type, such as but not limited to cylindrical or planar targets. Each of these targets comprises a sputterable target material of titanium or a titanium oxide. The substrate 20 is conveyed beneath all of the targets in sixth and seventh coat zones 56, 57 such that the overcoat layer 46 is applied to the previously deposited layers. The overcoat 46 can be seen as a separate layer but may form a portion of the second transparent dielectric film region or second oxide layer 44. The overcoat 46 is applied as a titanium oxide film having a thickness of any of the thicknesses disclosed herein for the overcoat layer 46, such as between about 135 Å and about 145 Å.

Embodiments of methods of coating substrates may be carried out as described above to form the any of the coatings disclosed herein. In such embodiments, the individual layers of the coatings may be applied to a substrate in the order shown or described to form the respective coatings. In embodiments, one or more additional layers of any of the layer types disclosed herein may be disposed between any of the layers disclosed in FIGS. 1 and 2, without limitation. For example, an additional INCONEL™ layer (e.g., nickel-chromium-molybdenum alloy layer) may be disposed on top of or between any of the layers disclosed in FIGS. 1 and 2.

It is understood that while a specific arrangement and number of coat zones and active sputtering bays may be described, there may be unused bays and/or coat zones positioned between one or more of the above-described zones and bays. Likewise, alternative positions, numbers and variations of the various components may be used without departing from the overall scope of the present invention. Furthermore, while magnetron sputtering is specifically described, in an alternative example of a method of applying a coating 30, the coating 30 may be preformed and applied to a substrate 20, such as by an adhesive. Alternatively, the coating 30 or properties thereof may be integrally formed with the substrate 20.

EXAMPLES

The following examples are presented as illustrations of the coating 30 and method of applying a coating 30 on a substrate 20 and are not intended to limit the overall scope of the present invention.

As can be seen from the following examples, the coating 30 and method of application of the coating 30 described herein maintains an equivalent level of light transmission from existing low-emissive coatings while providing improved SHGCs.

A coating was formed using the above noted techniques to form Working example 1. Working example 1 included the materials and thicknesses disclosed below in Table 1.

TABLE 1

| Layer Name | Material in Layer | Layer Thickness (Å) |
|---|---|---|
| Overcoat 46 | Tiox | 140 |
| Second oxide layer 44 | ZnO/SnO$_2$ | 136 |
| Second barrier layer 42 | Ti | 20-50 |
| Second metal layer 40 | Ag | 163 |
| First oxide layer 38 | ZnO/SnO$_2$ | 780 |
| First barrier layer 36 | Ti | 20-50 |
| First metal layer 34 | Ag | 164 |
| Alloy layer 32 | INCONEL ™ | 35 |
| Substrate 20 | Glass | ¼ inch |

Comparative examples 1-3 were also formed. The comparative examples 1-3 include currently available window coatings each including a single layer of silver and a base oxide layer in contact with the glass substrate. The thickness of comparative example 1 is less than the thickness of comparative example 2, which has a thickness that is less than the thickness of comparative example 3. Each of comparative examples 1-3 and working example 1 are low-emissivity coatings.

Working example 1 and comparative examples 1-3 were tested for visible light transmittance/reflectance and SHGC, on the inner surface of an outer pane of an IG unit (e.g., surface 72 of FIG. 3). The coating 30 having the properties described herein were tested according to National Fenestration Rating Council (NFRC) methods following NFRC 200-2004[E1A4] Procedure for Determining Fenestration Product solar heat Gain Coefficient and Visible Transmittance at Normal Incidence, which is hereby incorporated by reference in its entirety. The determined VLT and SHGC for each example are listed in Table 2 below.

TABLE 2

| Table 2 | SHGC | VLT % |
|---|---|---|
| Comparative Example 1 | 0.31 | 47 |
| Comparative Example 2 | 0.29 | 43 |
| Comparative Example 3 | 0.23 | 36 |
| Working Example 1 | 0.23 | 44 |

Figure 5:
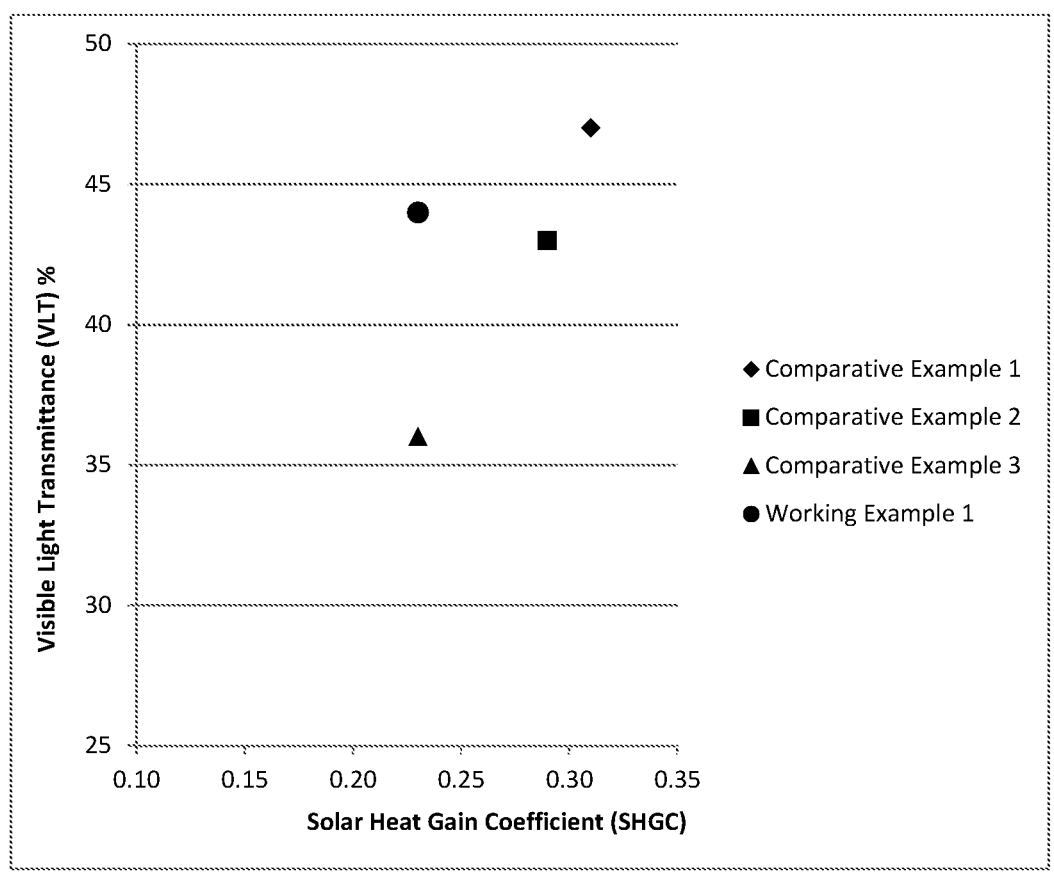
FIG. 5 is a graph of visible light transmittance versus solar heat gain coefficient in various examples.

FIG. 5 is a plot of the values of Table 2, showing the percentage of visible light transmittance ("VLT") through an IG unit having the respective example coatings thereon versus the solar heat gain coefficient of the same. As shown in FIG. 5, the performance of comparative example 1 included VLT of 47% and a SHGC of 0.31. The performance of comparative example 2 included VLT of 43% and a SHGC of 0.29. The performance of comparative example 3 included VLT of 36% and a SHGC of 0.23 (note that comparative example 3 was the thinnest of the comparative examples).

The performance of working example 1 showed VLT of 44% and an unexpected SHGC of 0.23. The VLT of comparative example 2 is similar to that of working example 1, while the SHGC of comparative example 2 is much higher than the SHGC of working example 1. The inventors currently believe that the unexpected difference in SHGC between similarly visible reflective materials is due at least in part to the location of the INCONEL™ layer positioned directly on the substrate rather than an oxide layer as in the case of comparative example 2.

Comparative examples 1-3 exhibited high exterior reflectance in a range between about 23-46%. Working example 1 exhibited mid-range exterior reflectance in a range of between about 20-30%.

As indicated, the low-emissivity coating 30 may be transparent or substantially transparent to at least a portion of visible light, and may be opaque or substantially opaque to infrared radiation. To this end, the coating 30 on the substrate 20 surface formed of the low-emissive material described may reflect a significant amount of radiant heat, thus lowering the total heat flow through the glass. The low-emissivity coating 30 may also, therefore, be arranged to allow for high solar gain, for moderate solar gain, or for low solar gain, by varying the amount of visible light and/or radiation permitted to pass through the substrate 20. The coating of working example 1 provided a Light to Solar Gain Ratio (LSG) (e.g., VLT divided by SHGC) of approximately 1.7. The coatings of comparative examples 1-3 also gave LSGs of about 1.7.

Although various representative embodiments have been described above with a certain degree of particularity, those skilled in the art could make numerous alterations to the disclosed embodiments without departing from the spirit or scope of the inventive subject matter set forth in the specification and claims. Joinder references (e.g., attached, coupled, connected) are to be construed broadly and may include intermediate members between a connection of elements and relative movement between elements. As such, joinder references do not necessarily infer that two elements are directly connected and in fixed relation to each other. In some instances, in methodologies directly or indirectly set forth herein, various steps and operations are described in one possible order of operation, but those skilled in the art will recognize that steps and operations may be rearranged, replaced, or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

Although the present invention has been described with reference to preferred embodiments, persons skilled in the art will recognize that changes may be made in form and detail without departing from the spirit and scope of the invention.

What is claimed is:

1. An insulating glass unit comprising:
   a first pane of glass;
   a second pane of glass;

a sealing element disposed between the first pane of glass and the second pane of glass, wherein the sealing element seals around a plurality of peripheral edges of the first pane of glass and the second pane of glass to form a chamber therebetween; and a coating applied to one or more of the first pane of glass or the second pane of glass, the coating comprising a plurality of layers, wherein a base layer of the plurality of layers is disposed directly on the first pane of glass or the second pane of glass and includes a nickel-chromium-molybdenum alloy and wherein two additional layers of the coating include silver.

2. The insulating glass unit of claim 1, wherein the nickel-chromium-molybdenum alloy comprises nickel, chromium, molybdenum, one or more of niobium or tantalum, and iron.

3. The insulating glass unit of claim 1, wherein the nickel-chromium-molybdenum alloy comprises at least about 58 weight % nickel, about 20 weight % to 23 weight % chromium, about 8 weight % to 10 weight % molybdenum, about 3.15 weight % to 4.15 weight % of one or more of niobium or tantalum, and less than about 5 weight % iron.

4. The insulating glass unit of claim 1, wherein the plurality of layers comprises, from the one or more of the first pane of glass or the second pane of glass outwardly:
the base layer having a thickness of between about 20 Å and about 50 Å;
a first metal layer including silver and having a thickness ranging from about 140 Å to about 180 Å;
a first barrier layer having a thickness ranging from about 20 Å and about 50 Å;
a first oxide layer having a thickness between about 500 Å and about 1000 Å;
a second metal layer including silver and having a thickness a thickness ranging from about 140 Å to about 180 Å;
a second barrier layer having a thickness ranging from about 20 Å and about 50 Å;
a second oxide layer having a thickness between about 110 Å and about 170 Å; and
an overcoat layer having a thickness ranging from about 100 Å to about 170 Å.

5. The insulating glass unit of claim 4, wherein:
the first barrier layer and the second barrier layer include titanium;
the first oxide layer and the second oxide layer include zinc oxide and tin oxide; and
the overcoat layer includes titanium oxide.

6. The insulating glass unit of claim 1, further comprising a low-conductance gas in the chamber.

7. The insulating glass unit of claim 6, wherein the low-conductance gas includes argon.

8. The insulating glass unit of claim 1, wherein:
the first pane of glass includes an outer surface and an inner surface;
the second pane of glass includes an outer surface and an inner surface; and
the sealing element, the inner surface of the first pane of glass, and the inner surface of the second pane of glass form the chamber.

9. The insulating glass unit of claim 8, wherein the coating is applied to the inner surface of the first pane of glass.

10. The insulating glass unit of claim 9, wherein first pane of glass forms an external surface of the insulating glass unit.

11. The insulating glass unit of claim 8, wherein the coating is applied to the inner surface of the second pane of glass.

12. An insulating glass unit comprising:
a first pane of glass having a first inner surface and a first outer surface;
a second pane of glass having a second inner surface and a second outer surface;
a sealing element disposed between the first pane of glass and the second pane of glass, wherein the sealing element seals around a plurality of peripheral edges of the first inner surface and the second inner surface to form a chamber therebetween; and
a coating applied to the first inner surface, the coating comprising a plurality of coextensive layers including:
a base alloy layer disposed directly on the first inner surface, the base layer including an alloy of nickel, chromium, and molybdenum;
a first metal layer disposed on the base alloy layer;
a first barrier layer disposed on the first metal layer;
a first oxide layer disposed on the first barrier layer;
a second metal layer disposed on the first oxide layer;
a second barrier layer disposed on the second metal layer;
a second oxide layer disposed on the second barrier layer; and
an overcoat layer disposed on the second oxide layer.

13. The insulating glass unit of claim 12, wherein:
the first metal layer has a thickness ranging from about 140 Å to about 180 Å;
the first barrier layer has a thickness ranging from about 20 Å and about 50 Å;
the first oxide layer has a thickness between about 500 Å and about 1000 Å;
the second metal layer has a thickness a thickness ranging from about 140 Å to about 180 Å;
the second barrier layer has a thickness ranging from about 20 Å and about 50 Å;
the second oxide layer has a thickness between about 110 Å and about 170 Å; and
the overcoat layer has a thickness ranging from about 100 Å to about 170 Å.

14. The insulating glass unit of claim 12, wherein:
the first metal layer and the second metal layer include one or more of gold, silver, or copper;
the first barrier layer and the second barrier layer include titanium;
the first oxide layer and the second oxide layer include zinc oxide and tin oxide; and
the overcoat layer includes titanium oxide.

15. A method of making an insulating glass unit, the method comprising:
coating one or more of surfaces of a first pane of glass or a second pane of glass with a coating, the coating comprising a plurality of layers, wherein a base layer of the plurality of layers is disposed directly on the first pane of glass or the second pane of glass and includes a nickel-chromium-molybdenum alloy and wherein two additional layers of the coating include silver;
a sealing the first pane of glass and the second pane of glass with a sealing element, wherein the sealing element seals around a plurality of peripheral edges of the first pane of glass and the second pane of glass to form a chamber therebetween.

16. The method of claim 15, wherein coating one or more surfaces of a first pane of glass or a second pane of glass with a coating includes:

applying an alloy layer directly onto the first pane of glass or the second pane of glass by sputtering, the alloy layer including a nickel-chromium-molybdenum alloy material;

applying a first metal layer over the alloy layer by sputtering, the first metal layer including one or more of a gold material, a silver material, or a copper material;

applying a second metal layer over the first metal layer by sputtering, the second metal layer including one or more of a gold material, a silver material, or a copper material, wherein the alloy layer.

17. The method of claim 16, further comprising:

applying a first oxide layer over the first metal layer by sputtering, prior to applying the second metal layer; and applying a second oxide layer over the second metal layer.

18. The method of claim 17, further comprising:

applying a first barrier layer over the first metal layer by sputtering prior to applying the first oxide layer;

applying a second barrier layer over the second metal layer by sputtering prior to applying the second oxide layer; and applying an overcoat layer over the second oxide layer by sputtering.

19. The method of claim 15, wherein coating one or more of surfaces of a first pane of glass or a second pane of glass with a coating includes coating one or more of a first inner surface of the first pane of glass or a second inner surface of the second pane of glass with the coating.

* * * * *